United States Patent

Zepic et al.

[11] Patent Number: 5,771,928
[45] Date of Patent: Jun. 30, 1998

[54] ROTARY SLIDE VALVE FOR SELECTIVE APPLICATION OF PRESSURIZED AIR OR VACUUM TO AN APPARATUS

[75] Inventors: Janez Zepic, Ljubljana; Kilijan Vizjak, Kranjj, both of Slovenia

[73] Assignee: LPKF D.O.O., Kranj, Slovenia

[21] Appl. No.: 764,462

[22] Filed: Dec. 12, 1996

[30] Foreign Application Priority Data

Dec. 16, 1995 [DE] Germany ........................ 195 47 124.5

[51] Int. Cl.⁶ ............................................... F16K 11/076
[52] U.S. Cl. ................................ 137/625.22; 137/625.47
[58] Field of Search ........................... 137/625.22, 625.47

[56] References Cited

U.S. PATENT DOCUMENTS 1,059,485  4/1913  Orlopp ............................ 137/625.22 X
2,133,580  10/1938  Searle .............................. 137/625.22 X

FOREIGN PATENT DOCUMENTS 75 22 188  10/1975  Germany .
3509626  9/1986  Germany .

Primary Examiner—Gerald A. Michalsky
Attorney, Agent, or Firm—Evenson, McKeown, Edwards & Lenahan P.L.L.C.

[57] ABSTRACT

A rotary slide valve (1) for selective delivery of pressurized air or vacuum to an apparatus (3), which permits a very precise delivery of vacuum or pressurized air through a control port (2), especially to a plenum (16) of an apparatus (3) for introducing a conductive paste into holes (22) in circuit boards (17). Two transfer passages (10 and 11) are disposed in a rotary slide (9) offset by 120° around the axis of rotation, and transfer ducts (12, 13 and 14) contiguous with the rotary slide and communicating with the control port (2) and with inlet/outlet ports (7 and 8) are arranged in a reference plane likewise offset by 120° around the axis of rotation. A vacuum connection (5) and a pressurized air connection (6) are arranged on the housing (4) offset from the reference plane in the longitudinal direction of the rotary slide (9) and in communication with the transfer passages (10 and 11), and in the housing (4) between the transfer duct (12) of the control port (2) and the transfer ducts (13 and 14) of the inlet/outlet ports (7 and 8) closed housing wall sections (23 and 24) are formed which extend over a greater angle than the transfer passages (10 and 11) of the rotary slide (9) such that, alternately, the vacuum connection (5) or the pressurized air connection (6) can be connected to the control port (2) or to the inlet/outlet ports (7 and 8), and in intermediate positions of the rotary slide (9) the transfer passages (10 and 11) are closed off by the housing wall sections (23 and 24).

4 Claims, 4 Drawing Sheets

ROTARY SLIDE VALVE FOR SELECTIVE APPLICATION OF PRESSURIZED AIR OR VACUUM TO AN APPARATUS

BACKGROUND OF THE INVENTION

The invention relates to a rotary slide valve for selectively applying pressurized air or a vacuum to an apparatus, especially to a plenum chamber of an apparatus for delivering conductive paste to holes in printed circuit boards, the connection being carried out through a control port disposed in the valve housing.

An apparatus for producing a brief gaseous or vacuum pulse in a vacuum chamber of an apparatus for delivering conductive paste into holes in a printed circuit board has been disclosed in published German Patent Application No. DE 3,509,626. In this apparatus, however, the conductive paste is put into the holes in printed circuit boards only by means of a vacuum, a vacuum valve being actuated by compressed air.

A rotary slide valve for switching between pressurized air and a vacuum has been disclosed by German Utility Model DE-GM 75 22,188. The special design of this apparatus is said to achieve a reduction of the resistance to flow in the rotary slide valve.

SUMMARY OF THE INVENTION

It is the object of the invention selectively to supply vacuum or pressurized air under precise control by means of a single rotary slide valve and a single blower.

This and other objects of the invention have been achieved by providing a rotary slide valve for selective application of vacuum or pressurized air to an apparatus through a control port disposed in a valve housing, the valve comprising a valve rotor disposed in the housing and having an axis of rotation, the rotor having two longitudinally axially extending transfer passages formed in circumferential portions thereof offset 120° from each other about the axis of rotation thereof, the housing being formed with three transfer ducts opening contiguous to the rotor and lying in a common reference plane offset 120° from each other about the rotor axis, one of the transfer ducts communicating with the control port, a second communicating with a first inlet/outlet port, and a third communicating with a second inlet/outlet port, the housing further being provided with a vacuum connection and a pressurized air connection each communicating with a respective one of the longitudinally extending transfer passages, the housing additionally comprising closed wall sections between the control port transfer duct and the inlet/outlet port transfer ducts and between the inlet/outlet port transfer ducts, the closed wall sections each covering a larger circumferential portion of the rotor than either of the two transfer passages, such that the vacuum connection or the pressurized air connection can selectively be connected to the control port or to the respective inlet/outlet ports by rotating the rotor so that the transfer passage communicating with the respective connection confronts the transfer duct communicating with the respective port, or the valve can be shut off by rotating the rotor so that the transfer passages confront closed wall sections of the housing.

In accordance with preferred aspects of the invention, the control port is connected to a plenum of an apparatus for delivering conductive paste to holes in printed circuit boards; the vacuum connection and the pressurized air connection are each offset longitudinally from the reference plane, with one of the connections arranged on an axial end face of the housing, and the other of the connections arranged on a lateral side face of the housing; and the rotor is driven by a stepper motor controlled by a microprocessor, so that a desired sequence of application of vacuum and pressurized air can be programmed into the apparatus.

Thus, in the apparatus of the invention, by disposing two transfer passages in the rotary slide, offset 120° about the axis of rotation of the valve and extending in its longitudinal direction, and by arranging transfer passages or ducts for the control port and the two inlet/outlet ports in the housing, contiguous to the rotary slide and lying in a reference plane likewise offset by 120° about the axis of rotation of the rotary slide, and by arranging a pressurized air connection and a vacuum connection offset from the reference plane in the longitudinal direction of the rotary slide in communication with the transfer passages, and by forming closed wall sections in the housing between the transfer duct of the control port and the transfer ducts of the inlet/outlet ports, extending over a greater angle than the transfer passages of the rotary slide valve, it is possible to selectively connect the vacuum connection or the pressurized air connection to the control port or to the inlet/outlet ports, and when the transfer passages of the rotary slide are in intermediate positions they are shut off from the housing sections.

In accordance with the invention, the vacuum and pressurized air connections are arranged offset longitudinally, end-wise and laterally.

According to a preferred embodiment of the invention, the rotary slide valve is driven by a stepper motor controlled through a microprocessor. The valve can thus be rotated very sensitively, while the necessary settings are programmable and thus always instantly repeatable.

BRIEF DESCRIPTION OF THE DRAWINGS

The invention will be described in further detail hereinafter with reference to an illustrative preferred embodiment shown in the accompanying drawings in which.

DETAILED DESCRIPTION OF PREFERRED EMBODIMENTS

Figure 9:
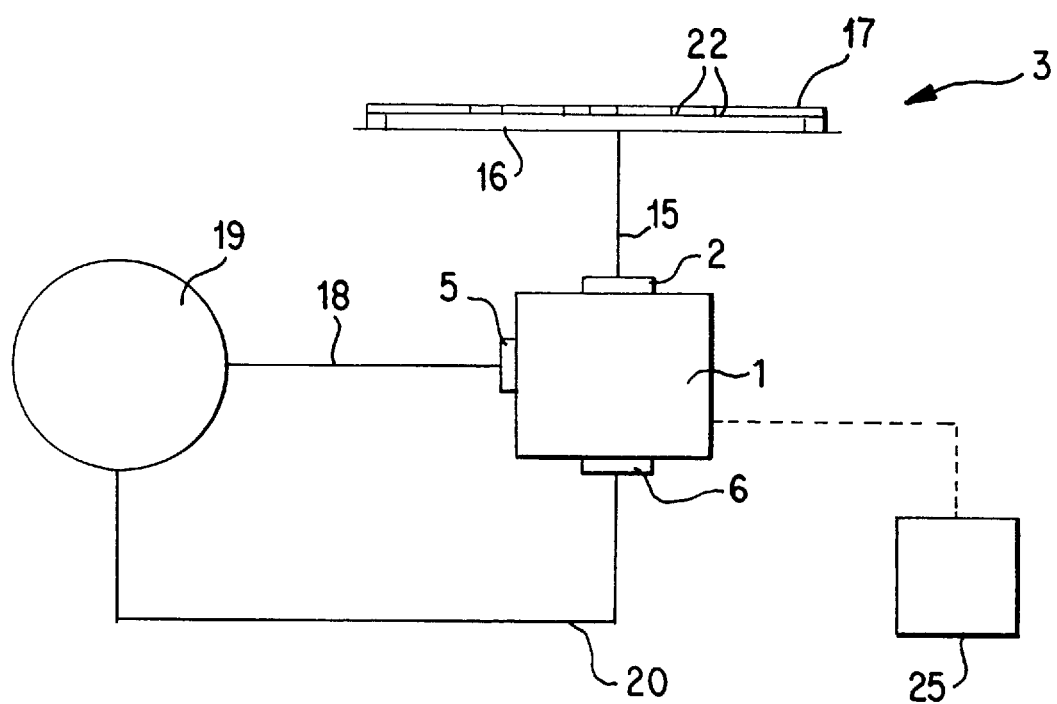
FIG. 9 is a schematic view of an apparatus for delivering conductive paste to holes in a printed circuit board comprising a rotary slide valve according to the invention.

In the drawing, 1 identifies a rotary slide valve which has a control port 2 for the selective delivery of pressure or vacuum to an apparatus 3 represented in FIG. 9. In the housing 4 of the rotary slide valve 1 there is also a vacuum connection 5 and a pressurized air connection 6. Moreover the housing 4 of the rotary slide valve 1 has inlet/outlet ports 7 and 8. Noise suppressors or mufflers, not shown in the drawing, are preferably disposed at the inlet/outlet openings 7 and 8.

Figure 5:
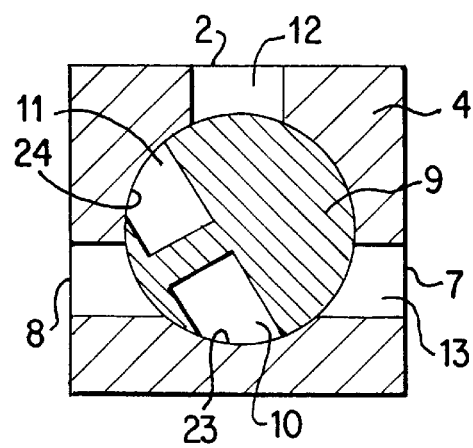
FIG. 5 is a cross-sectional view corresponding to FIGS. 2 through 4 in which the rotary slide has been turned clockwise to its position of readiness to supply pressurized air to the control port.
Figure 6:
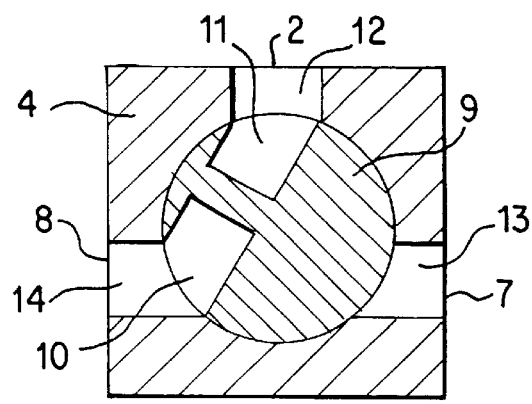
FIG. 6 is a cross-sectional view corresponding to FIGS. 2 through 5 in which the rotary slide has been turned to its end position for a full application of pressurized air to the control port.
Figure 7:
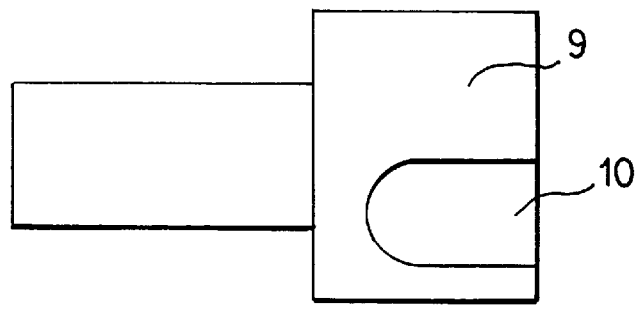
FIG. 7 is a side view of the rotary slide of FIG. 1.
Figure 8:
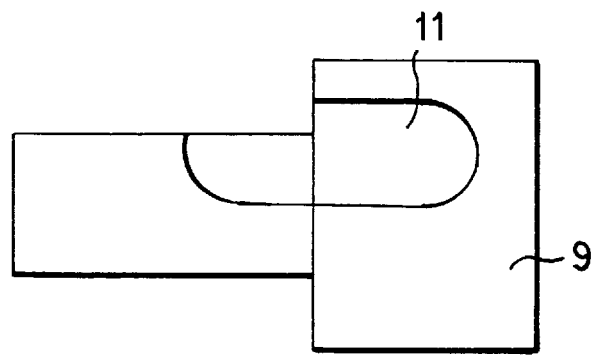
FIG. 8 is a view of the rotary slide of FIG. 7 rotated 180°.

In the housing 4 of the rotary slide valve 1 there is a rotor or rotary slide 9 shown in FIGS. 7 and 8. The rotary slide 9 has two transfer passages 10 and 11 offset by 120° and extending in the lengthwise or axial direction. As can be seen from the cross sections taken through the rotary slide valve 1 in FIGS. 2 to 6, transfer ducts 12, 13 and 14 are disposed in the housing and are associated respectively with the control port 2 and the inlet/outlet ports 7 and 8. The transfer ducts 12, 13 and 14 are disposed offset 120° in the housing 4. At the same time shut-off housing portions 23 and 24 are formed between the transfer passage 12 of the control port 2 and the transfer passages 13 and 14 of the inlet/outlet ports 7 and 8. Housing wall portions 23 and 24 extend over a wider angle than the transfer passages 10 and 11 of the rotary slide 9. When the rotary slide 9 is in the positions represented in FIGS. 3 and 5, its transfer passages 10 and 11 are closed by the housing wall portions 23 and 24.

FIG. 9 depicts an apparatus 3 for introducing conductive paste into holes 22 in printed circuit boards 17. Apparatus 3 comprises a distributing chamber or plenum 16 which can be supplied alternately with vacuum or pressurized air by means of the rotary slide valve 1 according to the invention. A control line 15 runs from the control port 2 of the rotary slide valve 1 to the plenum 16 underneath a circuit board 17 disposed on the apparatus 3. From the vacuum connection 5 of the rotary slide valve 1 a line 18 runs to a blower 19. A line 20 likewise runs to the blower 19 from the pressurized air connection 6 of the rotary slide valve 1.

The rotary slide 9 of the rotary slide valve 1 can be rotated by means of a stepper motor 21. The stepper motor 21 is preferably controlled by means of a microprocessor 25 so that the necessary delivery of the vacuum or pressurized air can be programmed and adapted to various conditions.

Figure 1:
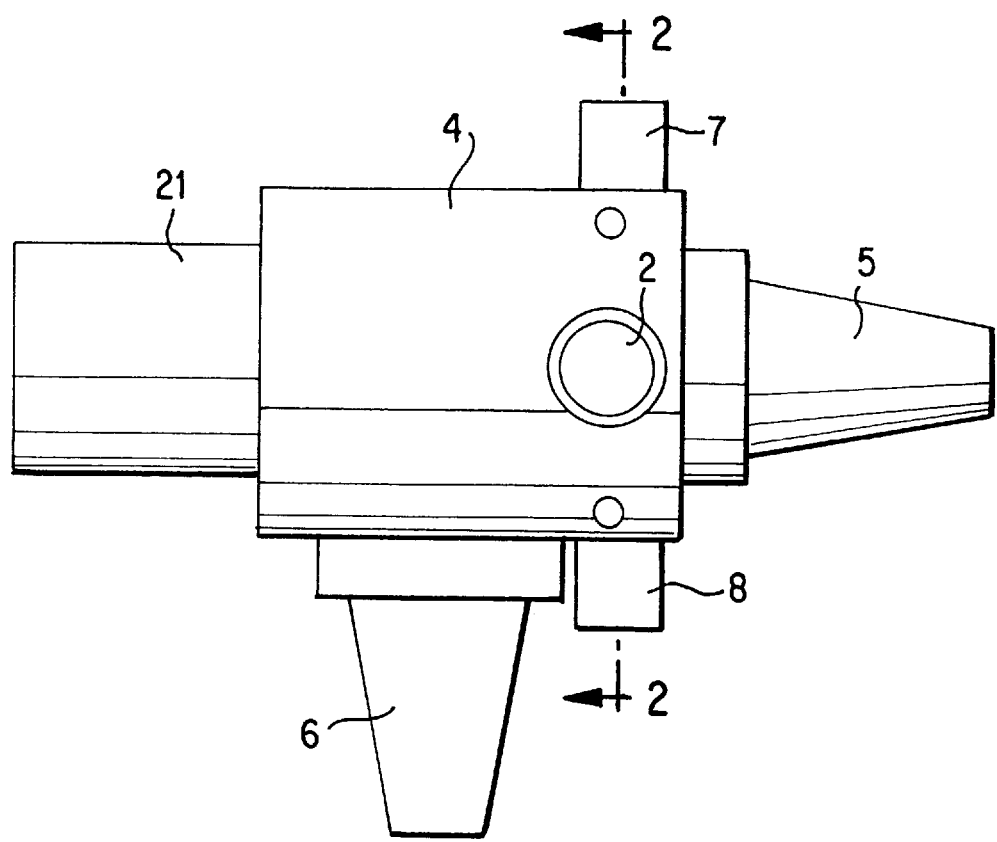
FIG. 1 is a plan view of a rotary slide valve according to the invention.
Figure 2:
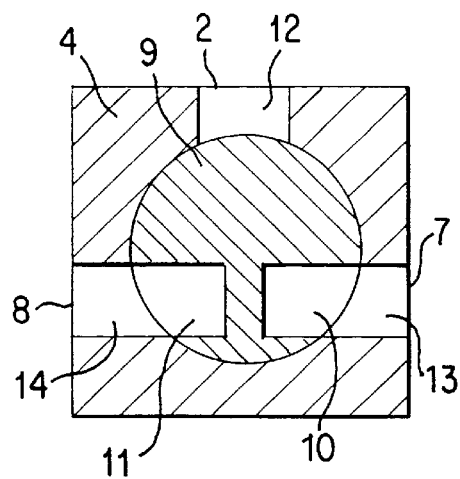
FIG. 2 is a cross-sectional view taken along line 2—2 through the rotary slide valve of FIG. 1 and its rotary slide, with the slide in its base position.

In FIG. 2 of the drawing the rotary slide 9 of the rotary slide valve 1 is shown in its base position in the valve housing 4. In this position the pressurized air connection 6 of the rotary slide valve 1 is connected via the longitudinally extending transfer passage 11 of the rotary slide 9 through the transfer duct 14 to the adjacent inlet/outlet port 8. The pressurized air from the blower 19, as represented in FIG. 9 therefore exits through the inlet/outlet port 8. At the same time the end vacuum connection 5 of the rotary slide valve 1 is connected via the transfer passage 10 of the rotary slide 9 through the transfer duct 13 to the adjacent inlet/outlet port 7. The blower 19 consequently aspirates air through a large cross-section unhindered through line 18 and the inlet/outlet port 7. In the valve rotor position shown in FIG. 2, the control port 2 of the rotary slide valve 1 is closed by the rotary slide 9. Consequently no pressurized air or vacuum is applied to the apparatus 3.

Figure 3:
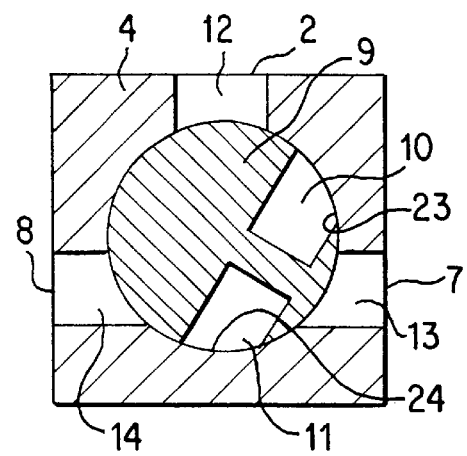
FIG. 3 is a cross-sectional view corresponding to FIG. 2 in which the rotary slide has been turned clockwise to its position of readiness to apply a vacuum to the control port.

If a vacuum is to be applied to the apparatus 3, i.e., to its plenum 16 underneath the printed circuit board 17, in order to draw conductive paste into holes 22 in the circuit board 17, the rotary slide 9 is rotated clockwise by the stepper motor 21 to the position shown in FIG. 3. It can be seen that when the rotary slide 9 is in the position shown in FIG. 3, the transfer passage 10 of the rotary slide 9, which is under vacuum through the end vacuum connection 5 of the rotary slide valve 1, is briefly shut off completely in the plane of the control port 2. With the rotor 9 in this position, the transfer duct 13 is closed, and so is the inlet/outlet port 7. This prevents vacuum from being drawn simultaneously and uncontrolledly through the inlet/outlet port 7 and through the control port 2.

As soon as the rotary slide 9 is rotated further by the stepper motor 21, a precise open cross section can be established between the transfer passage 10 and the transfer duct 12 of the control port 2. An open connection between the vacuum connection 5 and the inlet/outlet port 7 no longer exists when the rotary slide 9 is in this position. This assures that the air is drawn from the plenum 16 of the apparatus 3 through the control port 2 alone, under the control of a precisely defined open cross section.

Figure 4:
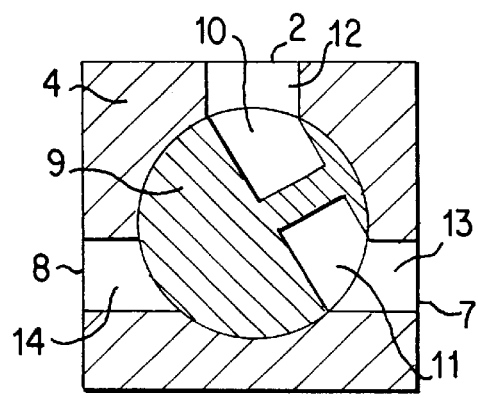
FIG. 4 is a cross-sectional view corresponding to FIGS. 2 and 3 in which the rotary slide has been turned clockwise to its end position for full application of a vacuum to the control port.

Finally, the end position of the rotary slide 9 is shown in FIG. 4, in which the vacuum is applied to the plenum 16 of apparatus 3 through the fully open cross section of the rotary slide valve 1. By the application of vacuum to the underside of the circuit board 17, conductive paste previously applied to the opposite side of printed circuit board, preferably by silk screen printing, is drawn into the holes 22. Pressurized air from pressurized air connection 6 and transfer passage 11 exits through transfer duct 13 and inlet/outlet port 7. Then the rotary slide 9 is turned back to its initial position represented in FIG. 2.

To remove excess conductive paste from the holes 22 in printed circuit board 17, it is necessary to feed pressurized air into the plenum 16. For this purpose the rotary slide 9 of rotary slide valve 1 first is rotated clockwise to the position shown in FIG. 5. It can be seen that with the rotary slide 9 in the position shown in FIG. 5, the transfer passage 11 of the rotary slide 9, to which pressurized air was being delivered from the pressurized air connection 6 which is offset longitudinally from the plane of the control port 2, is briefly shut off completely from transfer duct 12. With the rotary slide 9 in this position, the transfer duct 14 and the inlet/outlet port 8 also are closed. This prevents pressurized air from escaping uncontrolledly through the inlet/outlet port 8 and/or through the control port 2.

As soon as the rotary slide 9 is rotated further clockwise as shown in FIG. 6, a connection is created between the transfer passage 11, which carries pressurized air from pressurized air connection 6, and the transfer duct 12 and control port 2. The open cross section increases with the angle of rotation. The configuration according to the invention thus assures that all pressurized air will reach the control port 2 through established open cross sections of the rotary slide valve 1, and will be unable ever to escape in an uncontrolled manner. By regulating the degree of rotation of the rotor 9 and the consequent amount of overlap between transfer passage 11 and transfer duct 12, the amount of pressurized air introduced into the plenum 16 of the apparatus 3 can always be precisely controlled and proportioned. Thus it is possible to remove excess conductive paste from holes 22 in the circuit board 17, leaving a thin, but nevertheless conductive, portion of conductive paste deposited on the inner sides of the holes. Furthermore, in this manner contacts of defined thickness can be created at the edges of the holes. Meanwhile, vacuum connection 5 communicates through transfer passage 10 with transfer duct 14 and inlet/outlet port 8, and transfer duct 13 and inlet/outlet port 7 are closed off.

After the contacts have been formed in the circuit board 17, the rotary slide 9 is returned to the position represented in FIG. 2. The vacuum and the pressurized air delivered by the blower 19 to the rotary slide valve 1 via lines 18 and 20 can, as already described, pass unhindered through large open cross sections through the rotary slide valve 1.

In addition to the advantage of the precise ability to control the vacuum and pressurized air delivery, the apparatus of the invention has the additional advantage that only a single rotary slide valve 1 is necessary, which can be supplied with vacuum and pressurized air by a single blower 19. The result is a low-cost solution to the problem of selective application of vacuum or pressurized air.

The foregoing description and examples have been set forth merely to illustrate the invention and are not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A rotary slide valve for selective application of vacuum or pressurized air to an apparatus through a control port disposed in a valve housing, said valve comprising a valve rotor disposed in the housing and having an axis of rotation, said rotor having two longitudinally axially extending transfer passages formed in circumferential portions thereof offset 120° from each other about the axis of rotation thereof;

said housing being formed with three transfer ducts opening contiguous to the rotor and lying in a common reference plane offset 120° from each other about the rotor axis, one of said transfer ducts communicating with the control port, a second communicating with a first inlet/outlet port, and a third communicating with a second inlet/outlet port; said housing further being provided with a vacuum connection and a pressurized air connection each communicating with a respective one of the longitudinally extending transfer passages, said housing additionally comprising closed wall sections between the control port transfer duct and the inlet/outlet port transfer ducts and between the inlet/outlet port transfer ducts, said closed wall sections each covering a larger circumferential portion of the rotor than either of the two transfer passages;

wherein the vacuum connection or the pressurized air connection can selectively be connected to the control port or the respective inlet/outlet ports by rotating the rotor so that the transfer passage communicating with the respective connection confronts the transfer duct communicating with the respective port, or the valve can be shut off by rotating the rotor so that the transfer passages confront closed wall sections of the housing.

2. A rotary valve according to claim 1, wherein the control port is connected to a plenum of an apparatus for delivering conductive paste to holes in printed circuit boards.

3. A rotary slide valve according to claim 1, wherein the vacuum connection and the pressurized air connection are each offset longitudinally from said reference plane, with one of said connections being arranged on an axial end face of the housing, and the other of said connections being arranged on a lateral side face of the housing.

4. A rotary slide valve according to claim 1, wherein the rotor is driven by a stepper motor controlled by a microprocessor, whereby a desired sequence of application of vacuum and pressurized air can be programmed into the apparatus.

* * * * *